United States Patent [19]
Castera

[11] 4,291,283
[45] Sep. 22, 1981

[54] SINGLE-MODE TUNABLE OSCILLATOR USING MAGNETOSTATIC WAVES

[75] Inventor: Jean P. Castéra, Paris, France

[73] Assignee: Thomson-CSF, Paris, France

[21] Appl. No.: 34,183

[22] Filed: Apr. 27, 1979

[30] Foreign Application Priority Data

May 3, 1978 [FR] France .................. 78 13090

[51] Int. Cl.³ .............................. H03B 5/30
[52] U.S. Cl. .................. 331/96; 331/107 A; 331/135; 331/154; 333/144; 333/152
[58] Field of Search ......... 331/96, 99, 107 R, 107 SL, 331/135, 154, 157, 107 A, 108 B; 333/144, 147, 148, 150, 152, 161, 204, 205

[56] References Cited

U.S. PATENT DOCUMENTS

4,028,639  6/1977  Hagon et al. ............. 331/96 X

FOREIGN PATENT DOCUMENTS

2345262  3/1974  Fed. Rep. of Germany.
1470055  4/1977  United Kingdom ........... 331/107 A

OTHER PUBLICATIONS

Miller et al., "Tunable Magnetostatic Surface Wave Oscillator", Electronics Letters, vol. 12, No. 9, Apr. 29, 1976, pp. 209, 210.
"Surface-Acoustic-Wave Oscillator Tuned by Magnetoelastic Effect, Electronics Letters, vol. 13, No. 19, Sep. 15, 1977, pp. 589–590.
Parker et al., "A Saw Oscillator Using Two Acoustic Paths", 1976 IEEE Ultrasonics Symposium Proceedings, Sep. 29–Oct. 1, 1976, pp. 243–247.
Haworth, "A Magnetostatic Delay Line Oscillator", 1975 IEEE-MTT-S International, May 12–14, 1975, pp. 371–372.
Adam et al., "Microwave Magnetostatic Delay Devices Based on Epitaxial Yttrium Iron Garnet", Proceedings of IEEE, vol. 64, May 1976, pp. 794–800.

*Primary Examiner*—Siegfried H. Grimm
*Attorney, Agent, or Firm*—Cushman, Darby & Cushman

[57] ABSTRACT

An oscillator including two magnetostatic wave delay lines of different lengths formed on the surface of a magnetic material, one of whose ends is common and made by a first microstrip coupler, each of the other ends being made of a second and a third microstrip couplers respectively. The two lines are looped by means of a single amplifier. By selecting the two lengths, it is possible to obtain the desired interval between modes in such a way that there is a single oscillation mode comprised in the pass-band of the strips, in a pre-determined tuning band. This oscillator operates in the microwave range.

6 Claims, 11 Drawing Figures

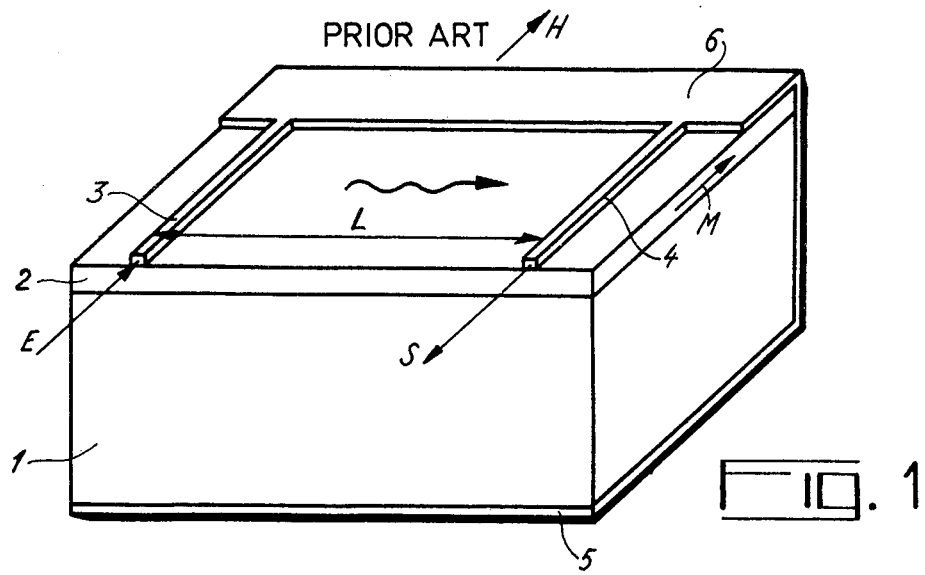
FIG. 1
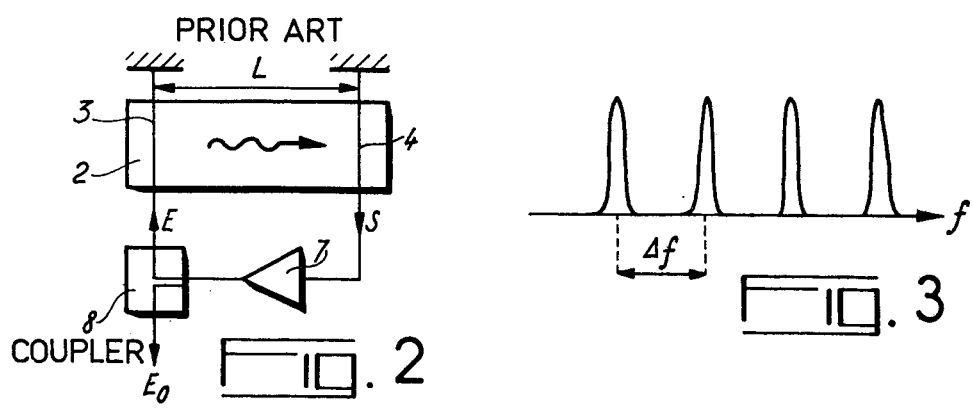
FIG. 2
FIG. 3
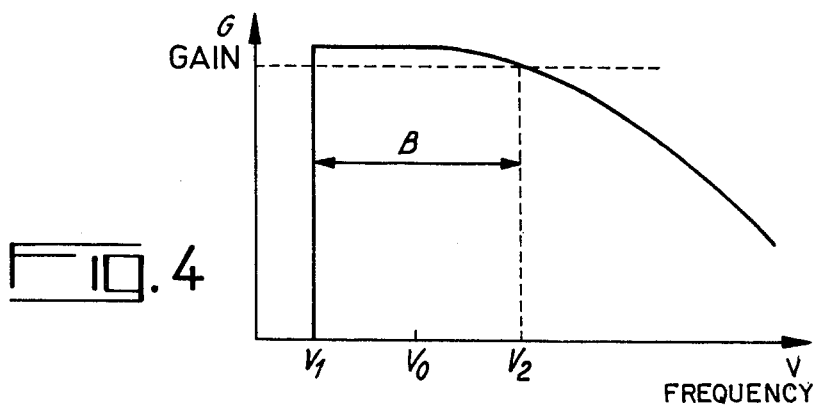
FIG. 4

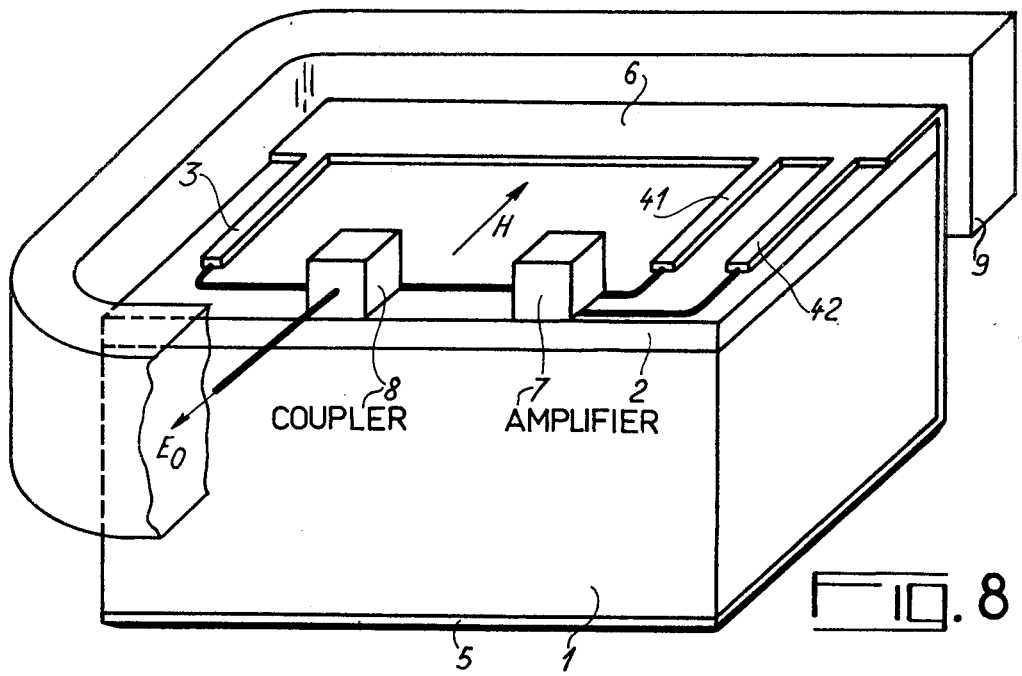
Fig. 8
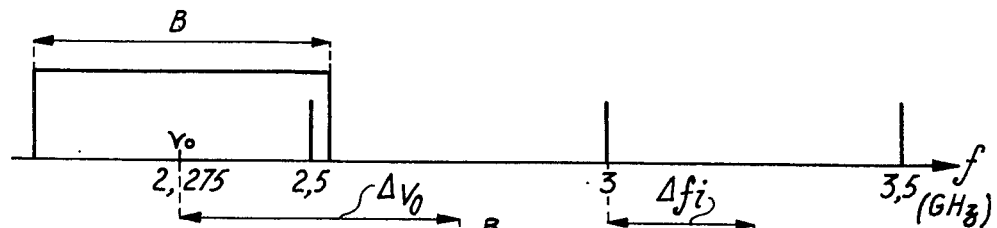
Fig. 9.a
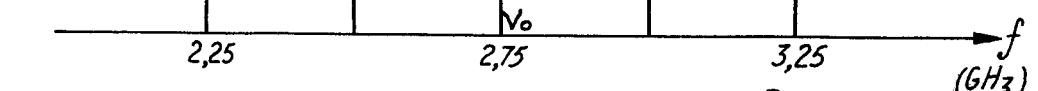
Fig. 9.b
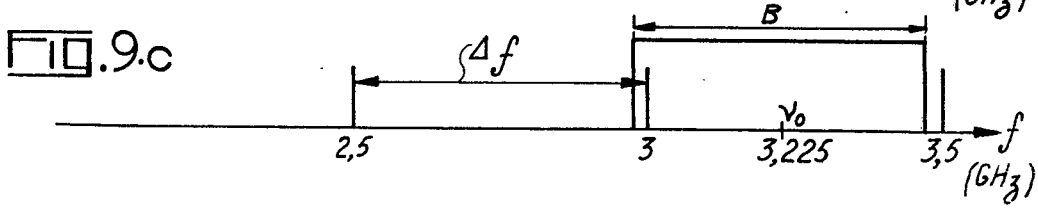
Fig. 9.c

SINGLE-MODE TUNABLE OSCILLATOR USING MAGNETOSTATIC WAVES

FIELD OF THE INVENTION

The invention relates to a single-mode oscillator operating in the microwave range using the magnetostatic waves that can be propagated on the surface of a thin layer of magnetic material with the control of an external magnetic field, this oscillator being tunable by varying the magnetic field intensity.

DESCRIPTION OF THE PRIOR ART

Tunable oscillators under the control of a magnetic field have already been designed including a delay line formed in a thin magnetic layer. These oscillators use the propagation of magneto-elastic waves resulting from the interaction of the magnetic waves set up by a magnetic field in a magnetic layer and the elastic waves generated by piezo-electric effect in the delay line constituted between an input transducer to which an electric voltage is supplied and an output transducer. As the propagation of magneto-elastic waves is bound up with the displacement of substances, the oscillation frequency that can be obtained by interconnecting the delay line in a feedback loop via an amplifier is in the range from about 10 MHz to about 1 GHz and practically between 50 and 500 MHz. On the other hand, the tuning range which can be obtained by varying the magnetic field is very small, about 1 to 5%.

In order to obtain oscillation frequencies in approximately the 1 to 10 GHz range, it is necessary to use another type of propagation that is possible in a magnetic material, i.e. that of magnetostatic waves. These waves, which are due to the movement of magnetization in the material, are of a purely magnetic nature. Excitation and detection of those waves are achieved by means of two short-circuited microstrip couplers made of conductive material which receive or supply ultra-high frequency currents. As the propagation of these waves is associated with spin displacements, an oscillator operating at frequencies around one GHz can be obtained by interconnecting the two couplers via an amplifier. It can be noted from simple reasoning in connection with the conditions of oscillation that, for a given magnetic field intensity, there exist several modes of oscillation that are equidistant in frequency. In order to obtain a single-mode oscillator, arrangements must be made to ensure that the pass-band of the couplers covers only one mode. It is not desirable to increase the interval between modes excessively as the more this interval increases, the poorer is the quality factor of the oscillator. It is conceivable in this case to reduce the pass-band of the transducers. One known means is to use multistrip couplers for the input and output of the delay line. The pass-band is far smaller than for a one strip coupler and it is thus possible to select a single mode. However, a problem arises when the magnetic field is varied in order to adjust the oscillation frequency: when the magnetic field varies, the frequency of the modes shifts and the pass-band is also displaced, but not at the same speed. In order for the selected mode to remain within the pass-band, the latter being small, it is necessary for the variation in the magnetic field to be very small, which restricts the possibility of tuning to a hundred or so MHz.

SUMMARY OF THE INVENTION

The invention provides an oscillator comprising, on the surface of the same magnetic layer, two magnetostatic wave delay lines of differing lengths. A simple method of forming said two lines is to place three transducers on the layer, the two lines being constituted by the distance between one of the transducers and each of the other two, that is to say, they have in common either the input transducer or the output transducer. The two lines are then looped up by means of a single amplifier. The oscillation modes of the two line-oscillator correspond to the frequencies for which the modes of the two lines coincide when taken separately. By suitably selecting the lengths of the two lines, it is possible to select the interval between modes at will, which obviates the need to reduce the pass-band of the transducers. The tuning range for the oscillation frequency can then extend over several hundreds of MHz, and even 1 to 2 GHz.

BRIEF DESCRIPTION OF THE DRAWINGS

Other features and advantages of the invention will become apparent from the following description and the accompanying figures, wherein:

FIG. 1 is a perspective view of a known magnetostatic surface waves delay line;

FIG. 2 is a schematic diagram of a known oscillator comprising a delay line;

FIG. 3 is a diagram showing the oscillation modes of the oscillator represented in FIG. 2;

FIG. 4 is the curve representing the transfer function of the loop of the oscillator in FIG. 2;

FIG. 8 illustrates an embodiment of the invention;

FIGS. 9a to 9c are explanatory diagrams showing how the parameters of the oscillator according to the invention are to be selected.

DESCRIPTION OF THE PREFERRED EMBODIMENTS

Figure 5:
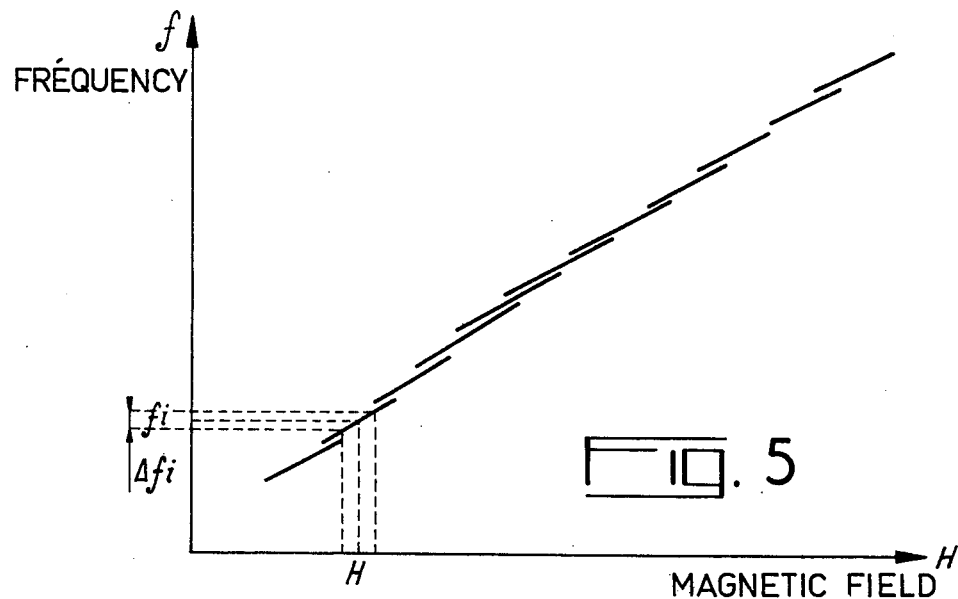
FIG. 5 is a diagram showing the drawbacks of known oscillators using multistrip couplers.

FIG. 1 shows a known magnetostatic surface wave delay line. It is constituted in a magnetic medium having a magnetization M to which is applied a constant magnetic field H. From Maxwell's equations, it can be deduced that the interaction between the applied field and the magnetization enables surface waves to be propagated in the material. The device in FIG. 1 comprises a non-magnetic substrate 1, for example gadolinium gallium garnet (G.G.G.) on which is deposited a thin layer 2 of a ferrimagnetic garnet obtained, for example, by epitaxial growth in liquid phase on the gadolinium gallium garnet. This ferrimagnetic garnet can be a pure yttrium iron garnet (Y.I.G.); the magnetic losses of this material are small and the surface waves generated can thus be used in devices of a planar structure such as delay lines, resonators, oscillators...

These waves are coupled by means of transducers which are metallic strips deposited on the layer 2. The delay line is formed between an input strip 3 and an output strip 4. One of the extremities of each transducer is connected to a metallic layer 5 located opposite the ferrimagnetic layer 2 in relation to the substrate 1 and which constitutes the earth of the device. The metallic layer 5 extends, covering one of the lateral faces of the substrate 1 and a portion 6 of the outer surface of the ferrimagnetic layer 2, which permits connection with the strips 3 and 4. To the other extremity of strip 3 is applied an input signal E whose frequency f is in the ultra-high frequency band (around one Gigahertz). At the other extremity of the strip 4, a signal S is recovered after propagation in the layer 2 between the two strips. As the latter are short-circuited, the electrical current is maximum there. It produces magnetic induction with a frequency f which has a movement of precession around the external magnetic field H. This precession is propagated between the two strips with a propagation speed V which depends on the properties of the ferrimagnetic material and on the magnetic field H. As a function of the length L between the two strips, the recovered current S is lagging in relation to the input current E by a delay $\tau$. The delay line represented in FIG. 1 can be used in various devices, and more particularly in an oscillator.

FIG. 2 is a schematic diagram of a known oscillator. On layer 2 are placed the strips 3 and 4 each having a first extremity connected to earth. The second extremity of strip 4, which supplies the current S, is connected to the input of an amplifier 7 which supplies the current E applied to the second extremity of strip 3. A directional coupler 8 also enables a fraction $E_0$ of the current E to be recovered. The oscillation conditions for such a device are that the loop gain is greater than 1 and that the total phase-shift caused by the delay line, the amplifier and the connecting leads is a whole multiple of $2\pi$. f being the oscillation frequency, $\tau$ the delay of the delay line, and $\theta_c$ the phase-shift effected by the amplifier and the leads, the latter condition is expressed as follows: $\theta_c + 2\pi f \tau = n2\pi$, n being an integer. The phase-shift $\theta_c$ is equivalent to a delay time $t_o\theta e/2\pi f$; the device of FIG. 2 is capable of oscillating at all the frequencies of the form $$f = \frac{n}{t_o + \tau},$$

comprised in the pass-band of strips 3 and 4 and such that the loop gain is greater than 1.

FIG. 3 represents the frequency spectrum of the oscillator. The interval between the frequencies of two adjacent modes is equal to $$\Delta f = \frac{1}{t_o + \tau}.$$

The proximity of the modes thus increases the greater is the time delay $\tau$. Furthermore, the quality factor of the oscillator is proportional to $\tau$.

FIG. 4 is a diagram representing the loop transfer function of the oscillator, that is to say the gain of loop G as a function of frequency $\nu$. In order to obtain an oscillation, the loop gain G must be greater than 1, and the amplifier gain must therefore be greater than the insertion losses. The transfer function has two cut-off frequencies, $\nu_1$ and $\nu_2$. The value of $\nu_2$ is a function of the width of the strips. It is known, in fact, that a strip with a width b enables waves with a wave number comprised between 0 and $\pi/b$ to be coupled. On the other hand, the insertion losses increase with the frequency. This is due to an increase in wave delay with the frequency, which leads to the increase in propagation losses. By adjusting the amplifier gain in such a way that the loop gain is equal to 1 in the vicinity of the frequency $\nu_2$, one obtains an oscillator whose loop gain does not vary by more than 3dB over the entire oscillation range. This range is centered around a frequency $\nu_0$ and has a width of $B = \nu_2 - \nu_1$.

Typical values obtained with an oscillator comprising a layer of YIG with a thickness of 10 $\mu$m, aluminium strips with a width of 50 $\mu$m, a length of 3 mm and distant by $L = 1$ cm, the magnetic field applied being $H = 200$ Oe are $B \approx 600$ MHz, $\nu_0 \approx 2$ GHz, $t_o + \tau \approx 120$ ns, $\Delta f \approx 9$ MHz. Comparison between B and $\Delta f$ shows that this oscillator is not single-mode. A known means of making it single-mode is to increase the value of $\Delta f$ by decreasing the length L, but this solution is rejected as it would be necessary to increase $\Delta f$ very considerably and the quality factor decreases when $\Delta f$ increases. Another known means is to reduce the pass-band by using multistrip couplers, that is to say couplers made of several metallic strips in parallel. With 6 strips having a width of 100 $\mu$m, disposed in parallel, one obtains a pass-band of 35 MHz. This method is suitable for an oscillator whose frequency is fixed or which is to be tuned over a reduced range. The object of the invention is to obtain a single-mode oscillator that can be tuned over a wide range, using the tuning facility offered by variation in the magnetic field. Now, as the delay $\tau$ has a variation that is substantially proportional to that of H, the variation $\Delta f_i$ of the frequency $f_i$ of a given mode is such that $$\frac{\Delta f_i}{f_i} = \frac{\Delta \tau}{\tau + t_o}.$$

The pass-band is also displaced. Its displacement can be calculated on the basis of the variation of the central frequency $\nu_0$ such that $\Delta \nu_0 / \nu_0 = \Delta \tau / \tau$. The displacement of the pass-band is thus more rapid than that of the oscillation modes. If the pass-band is centered on a value $f_i$ for a given magnetic field, in such a way as to select the single frequency mode $f_i$, for another value of the magnetic field, the pass-band having shifted in relation to the mode spectrum, the pass-band may cover another frequency, or two frequencies $f_j$ and $f_k$, or, on the contrary, no frequency may be present in the pass-band, if the latter is very small. FIG. 5 illustrates a variation curve giving the oscillation frequency (or frequencies) f as a function of the magnetic field H. This curve is formed by sections of straight lines separated by jumps which correspond to the interval $\Delta f$. Without jumps, the tuning range is very small: approximately 100 MHz with the values given above.

Figure 6:
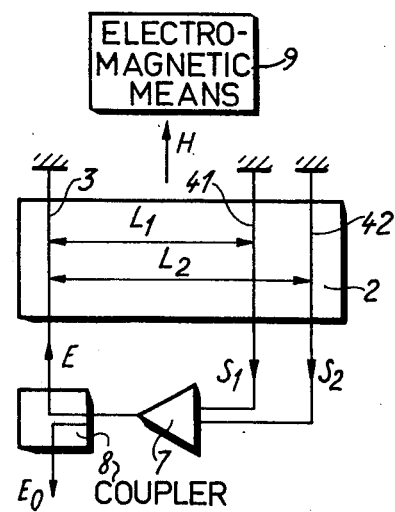
FIG. 6 is a schematic diagram of an oscillator in accordance with the present invention.

In a schematic diagram, FIG. 6 illustrates an oscillator according to the invention which is single-mode and can be tuned over a range of several hundreds of MHz. This oscillator comprises two delay lines placed in parallel in the same oscillation loop with a single amplifier. Three strip couplers are placed on the ferrimagnetic layer: an input strip 3 receiving a current E as before, and two output strips 41 and 42 supplying currents $S_1$ and $S_2$. One of the extremities of each strip is connected to earth. In this way, two delay lines are obtained on the same surface: a line with a length $L_1$ between the strips 3 and 41, giving a delay $\tau_1$ and a line with a length $L_2$, greater than $L_1$ between the strips 3 and 42, giving a delay $\tau_2 > \tau_1$. The signals $S_1$ and $S_2$ are added at the input of an amplifier 7. A small fraction $E_0$ of the signal obtained at the output of the amplifier is recovered at the output of the oscillator while the rest forms the input signal E of the delay line. The signal $E_0$ is extracted by means of the directional coupler 8. As layer 2 is subjected to a magnetic field H from electromagnetic means 9, the delay times $\tau_1$ and $\tau_2$ can be varied when the intensity of the magnetic field is varied. An oscillator according to the invention can also comprise two lines with lengths $L_1$ and $L_2$ having a common output strip, the output of the amplifier being connected to the respective input strips of the two lines. The arrangement of the two delay lines enables numerous variants to be obtained: on the same layer but not having common portions; each provided with their own input and output strips; on different layers, possibly formed of different materials, whether juxtaposed or otherwise, etc... Whatever its form of embodiment, the operation of an oscillator with two different delay lines can be explained on the basis of the frequency spectra of FIG. 7 corresponding to a given value for H. This Fig. is described from the top to the bottom. First, it shows the frequency spectrum for an oscillator formed from a line with delay $\tau_1$, whose total delay is $\tau_1 + t_{o1}$. The modes are spaced at intervals of $$\Delta f = \frac{1}{\tau_1 + t_{o1}}.$$

Figure 7:
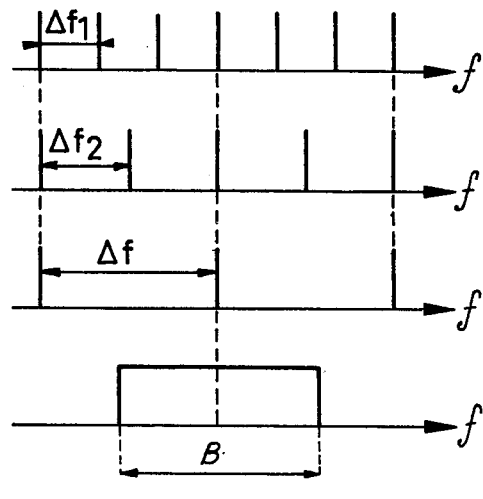
FIG. 7 is a diagram showing the oscillation modes of the oscillator in FIG. 6.

FIG. 7 then shows the frequency spectrum of an oscillator formed from a line with delay $\tau_2$ whose total delay is $\tau_2 + t_{o2}$. The intervals between the modes are $$\Delta f_2 = \frac{1}{\tau_2 + t_{o2}}.$$

FIG. 7 further shows the frequency spectrum of the oscillator of FIG. 6. It will be noted that the oscillation modes are those for which the frequencies coincide in the two first spectra. In the case of the figure, $$\frac{\tau_2 + t_{o2}}{\tau_1 + t_{o1}} = \frac{3}{2};$$

there is an interval between modes of $\Delta f = 3\Delta f_1 = 2\Delta f_2$. The use of two delay lines has thus made it possible to increase the interval between modes without any loss in quality factor. Finally, is represented the pass-band of the two delay lines. In order for the oscillator to be tunable, the variation of H must not eliminate the coincidence in frequency between the two first spectra, that is to say that $$\frac{\Delta \tau_1}{\tau_1 + t_{o1}} = \frac{\Delta \tau_2}{\tau_2 + t_{o2}}$$

now, $\Delta \tau_1 / \Delta \tau_2 = \tau_1 / \tau_2$, hence $$\frac{\tau_1 + t_{o1}}{\tau_2 + t_{o2}} = \frac{\tau_1}{\tau_2} = \frac{L_1}{L_2}$$

By suitably selecting the valued of the relation $(\tau_2 + t_{o2})/(\tau_1 + t_{o1})$, it is possible to determine at will the interval between the modes of the oscillator in such a way that said interval is sufficiently large as a function of the pass-band. The latter must be centred in relation to a given mode so as to enable the oscillation frequency to be tuned by varying the magnetic field H over a large range (in the same order of magnitude as the interval between modes).

FIG. 8 illustrates a form of embodiment of the oscillator according to the invention. It comprises a substrate of GGG, 1, 500 $\mu$m thick on the surface of which a layer of pure YIG, 2, with a thickness of 10 $\mu$m is epitaxially grown in liquid phase. The layer is parallel to a plane permitting easy orientation of the GGG (1, 1, 1). In this way a layer of uniform magnetization is obtained. Electro magnetic means 9, such as a permanent magnet, provides the magnetic field H, parallel to said plane and to the magnetization M of the layer.

The transducers 3, 41, 42 are very narrow strips (about 50 $\mu$m wide) made of any conductive material such as aluminium, copper, gold in order to obtain a wide pass-band (about 500 MHz). These strips can be obtained by vacuum spraying a layer of conductive material 5 $\mu$m thick and by photo-etching. The strips are 3 mm long. Their orientation on the layer 2 determines the angle between the direction of propagation and the field H, said angle being selected in such a way as to obtain maximum interactions. The distances between the strips, $L_1$ and $L_2$, can be very precise (to within a few $\mu$m) owing to the techniques of masking and photo-etching. The free surface area of the substrate 1 and one of its transverse faces is covered with a layer 5, of conductive material which may be the same as for the strips connected to the layer 6 formed on the surface of the layer 2 at the same time as the strips. The amplifier 7 can be an integrated circuit contained in a housing and located on the layer of YIG 2. This is, for example, a conventional amplifier constituted by field effect transistors. The directional coupler 8 is also located on the YIG layer. The strips 3, 41, 42, the amplifier 7 and the coupler 8 are linked up by coaxial cables whose sheath is connected to the earth layer 5.

As it has been seen above, the choice of lengths $L_1$ and $L_2$ depends on the desired performances of the oscillator. Approximative values for the different physical dimensions entering into this choice can be given and result from the design of an oscillator with $L_1 = 10$ mm and $L_2 = 15$ mm. When applying a magnetic field H of 180 Oe, we measured an oscillation frequency of $f_o = 2.1$ GHz and delay times of $t_{o1} + \tau_1 = 77$ ns and $t_{o2} + \tau_2 = 115$ ns. The corresponding values of $\Delta f_1$ and $\Delta f_2$ are $\Delta f_1 = 13$ MHz and $\Delta f_2 = 8.69$ MHz. The interval between the modes of the described oscillator is $\Delta f = 26$ MHz. The oscillation frequency is, furthermore, noted to be proportional to the field H. These values for $L_1$ and $L_2$ are given only for the purpose of verifying the operation of an oscillator comprising two delay lines. However, they are not suitable for a single-mode oscillator; in fact, the interval $\Delta f$ is far smaller than the pass-band, which is 500 MHz with 50 $\mu$m wide transducers.

The diagrams of FIGS. 9a, 9b and 9c explain the method recommended for selecting the different parameters of the oscillator. In the case of the example taken in the fig., the pass-band B is 500 MHz and the interval between modes is also 500 MHz. It is desired to be able to tune the oscillation frequency in a range of 500 MHz between 2.5 GHz and 3 GHz. The three figures are frequency diagrams for 3 values $H_1$, $H_2$, $H_3$ of the magnetic field corresponding respectively to oscillation frequencies of 2.5, 2.75 and 3 GHz. As central frequency $\nu_0$ of the pass-band varies more considerably as a function of H than the oscillation frequency $f_i$ of a given mode, the centering of the pass-band in relation to the oscillation mode is selected in such a way that the oscillation frequency for the field $H_1$ (2.5 GHz) is within the high frequencies of the band and, for the field $H_3$ (3 GHz) in the low frequencies of the band, while, in the case of $H_2$, the oscillation frequency (2.75 GHz) is in the centre of the band. In this way, by acting on the gain of the amplifier, the value of $\nu_0$ equal to 2.275 GHz, 2.75 GHz and 3.225 GHz was obtained for $H_1$, $H_2$ and $H_3$ respectively. In all cases, the value selected for B enables only one mode to be selected. For $\Delta f_i = 500$ MHz, we thus have $\Delta \nu_0 = 950$ MHz, giving the relationship:

$$\frac{\tau_1 + t_{o1}}{\tau_1} = \frac{\tau_2 + t_{o2}}{\tau_2} = \frac{950}{500} = 1.9.$$

The values of $\Delta f_1$ and $\Delta f_2$ are such that $\Delta f = 500$ MHz $= n_1 \Delta f_1 = n_2 \Delta f_2$, wherein $n_1$ and $n_2$ are incommensurable numbers. For example, $n_1 = 100$ and $\Delta f_1 = 5$ MHz; $n_2 = 111$ and $\Delta f_2 = 4.5$ MHz and we deduce therefrom $t_{o1} + \tau_1 = 200$ ns and $t_{o2} + \tau_2 = 222$ ns. The above relationship necessarily makes $\tau_1 = 105$ ns and $\tau_2 = 117$ ns; the values $t_{o1} = 95$ ns and $t_{o2} = 105$ ns can be obtained owing to the delays provided by the amplifier and the cables. In order to measure them, one can remove the delay lines from the circuit and measure the intervals of oscillation frequency obtained for the two loops. The lengths $L_1$ and $L_2$ are adjusted so as to obtain the above delay times $\tau_1$ and $\tau_2$, the relationship $L_2/L_1$ being equal to 1.11. They are approximately 15 mm. In order to adjust the oscillation frequency between 2.5 GHz and 3 GHz, one must vary the magnetic field between approximately 210 oe and 260 oe. All these values are given only by way of example and to show how to design a single-mode oscillator according to the invention. The applications according to the invention are for oscillators operating in the microwave range, such as radar, measuring instruments, etc. The device proposed is particularly advantageous by reason of its simplicity, its small size owing to the technology used and its large tuning capacity.

I claim:
1. A single-mode tunable oscillator comprising:
amplifier means having an input and an output,
two magnetostatic wave delay lines providing different delays and interconnected in feedback loops from said output to said input, said lines being made in a magnetic material arranged in a layer formed between short-circuited input and output strip couplers deposited on said layer,
electromagnetic means simultaneously subjecting said two lines to an external magnetic field,
extracting means for extracting a fraction of the electric signal present at said output, the frequency f of said signal being varied by variation of the intensity of said magnetic field.
2. An oscillator as claimed in claim 1, wherein said magnetic material is an yttrium iron garnet deposited on a substrate formed from a gadolinium gallium garnet.
3. An oscillator according to claim 1, wherein said two lines are located on the same layer, are of different lengths and have a common portion.
4. An oscillator as claimed in claim 3, wherein said two delay lines have a common end corresponding to a single input strip coupler and have two separate output strip couplers; said output strip couplers being both connected to said input.
5. An oscillator as claimed in claim 3, wherein said two delay lines have a common end corresponding to a single output strip coupler and have two separate input strip couplers, said input strip couplers being both connected to said output.
6. Oscillator according to claim 4 wherein said extracting means comprise a directional coupler having one input end and two output ends, said input end being connected to said output of said amplifier, one of said output ends being connected to the input strip coupler of each delay line, a fraction of the amplifier's output signal being provided at said second output end.

* * * * *